United States Patent
Bierhoff et al.

(10) Patent No.: US 9,865,427 B2
(45) Date of Patent: *Jan. 9, 2018

(54) USER INTERFACE FOR AN ELECTRON MICROSCOPE

(71) Applicant: FEI COMPANY, Hillsboro, OR (US)

(72) Inventors: Martinus Petrus Maria Bierhoff, Deurne (NL); Bart Buijsse, Eindhoven (NL); Cornelis Sander Kooijman, Veldhoven (NL); Hugo Van Leeuwen, Eindhoven (NL); Hendrik Gezinus Tappel, Casteren (NL); Colin August Sanford, Atkinson, NH (US); Sander Richard Marie Stoks, Nijmegen (NL); Steven Berger, Newburyport, MA (US); Ben Jacobus Marie Bormans, Asten (NL); Koen Arnoldus Wilhelmus Driessen, Valkenswaard (NL); Johannes Antonius Hendricus W. G. Persoon, Waalre (NL)

(73) Assignee: FEI Company, Hillsboro, OR (US)

(*) Notice: Subject to any disclaimer, the term of this patent is extended or adjusted under 35 U.S.C. 154(b) by 118 days.

This patent is subject to a terminal disclaimer.

(21) Appl. No.: 14/704,453

(22) Filed: May 5, 2015

(65) Prior Publication Data
US 2015/0332891 A1 Nov. 19, 2015

Related U.S. Application Data

(63) Continuation of application No. 12/303,717, filed as application No. PCT/US2007/070650 on Jun. 7, 2007, now Pat. No. 9,025,018.
(Continued)

(51) Int. Cl.
*H01J 37/26* (2006.01)
*H01J 37/18* (2006.01)
(Continued)

(52) U.S. Cl.
CPC .............. *H01J 37/26* (2013.01); *H01J 37/16* (2013.01); *H01J 37/18* (2013.01); *H01J 37/185* (2013.01);
(Continued)

(58) Field of Classification Search
CPC .......... H01J 37/28; H01J 37/26; H01J 37/261; H01J 37/302
See application file for complete search history.

(56) References Cited

U.S. PATENT DOCUMENTS

| 3,602,686 A | 8/1971 | Lempert |
| 3,812,365 A | 5/1974 | LePoole |

(Continued)

FOREIGN PATENT DOCUMENTS

| DE | 3332248 A1 | 3/1985 |
| EP | 0969494 A1 | 1/2000 |

(Continued)

OTHER PUBLICATIONS

Cameron, R.E. et al., "Minimizing Sample Evaporation in the Environmental Scanning Electron Microscope," Journal of Microscopy, Mar. 1994, vol. 173, No. 3, pp. 227-237.
(Continued)

*Primary Examiner* — Aaron Strange
(74) *Attorney, Agent, or Firm* — Scheinberg & Associates, P.C.; Michael O. Scheinberg; John E. Hillert

(57) ABSTRACT

A user interface for operation of a scanning electron microscope device that combines lower magnification reference images and higher magnification images on the same screen to make it easier for a user who is not used to the high magnification of electron microscopes to readily determine where on the sample an image is being obtained and to understand the relationship between that image and the rest of the sample. Additionally, other screens, such as, for
(Continued)

example, an archive screen and a settings screen allow the user to compare saved images and adjust the settings of the system, respectively.

16 Claims, 10 Drawing Sheets

Related U.S. Application Data

(60) Provisional application No. 60/811,621, filed on Jun. 7, 2006.

(51) Int. Cl.

| | | |
|---|---|---|
| *H01J 37/21* | (2006.01) | |
| *H01J 37/302* | (2006.01) | |
| *H01J 37/16* | (2006.01) | |
| *H01J 37/20* | (2006.01) | |
| *H01J 37/22* | (2006.01) | |
| *H01J 37/244* | (2006.01) | |
| *H01J 37/28* | (2006.01) | |

(52) U.S. Cl.
CPC ............. *H01J 37/20* (2013.01); *H01J 37/21* (2013.01); *H01J 37/226* (2013.01); *H01J 37/244* (2013.01); *H01J 37/261* (2013.01); *H01J 37/28* (2013.01); *H01J 37/302* (2013.01); *H01J 2237/1405* (2013.01); *H01J 2237/162* (2013.01); *H01J 2237/188* (2013.01); *H01J 2237/1825* (2013.01); *H01J 2237/2003* (2013.01); *H01J 2237/2006* (2013.01)

(56) References Cited

U.S. PATENT DOCUMENTS

| | | |
|---|---|---|
| 4,080,526 A | 3/1978 | Kihara et al. |
| 4,229,655 A | 10/1980 | Ryding |
| 4,241,259 A | 12/1980 | Feuerbaum et al. |
| 4,516,026 A | 5/1985 | Jouffrey et al. |
| 4,584,479 A | 4/1986 | Lamattina et al. |
| 4,607,167 A | 8/1986 | Petric |
| 4,705,949 A | 11/1987 | Grimes, II et al. |
| 4,818,838 A | 4/1989 | Young et al. |
| 4,999,496 A | 3/1991 | Shaw et al. |
| 5,103,102 A | 4/1992 | Economou et al. |
| 5,254,856 A | 10/1993 | Matsui et al. |
| 5,300,776 A | 4/1994 | Krivanek |
| 5,396,067 A | 3/1995 | Suzuki et al. |
| 5,399,860 A | 3/1995 | Miyoshi et al. |
| 5,453,617 A | 9/1995 | Tsuneta et al. |
| 5,591,970 A | 1/1997 | Komano et al. |
| 5,852,270 A | 12/1998 | Holkeboer |
| 5,869,833 A | 2/1999 | Richardson et al. |
| 6,057,553 A | 5/2000 | Khursheed et al. |
| 6,320,194 B1 | 11/2001 | Khursheed et al. |
| 6,421,122 B2 | 7/2002 | Nara et al. |
| 6,552,340 B1 | 4/2003 | Krivanek et al. |
| 6,559,457 B1 | 5/2003 | Phan et al. |
| 6,621,082 B2 | 9/2003 | Morita et al. |
| 6,667,475 B1 | 12/2003 | Parran et al. |
| 6,683,316 B2 * | 1/2004 | Schamber ........... G01N 23/2251 250/492.1 |
| 6,710,354 B1 | 3/2004 | Koch et al. |
| 6,768,114 B2 * | 7/2004 | Takagi .................. H01J 37/222 250/306 |
| 6,831,278 B2 | 12/2004 | Yamamoto et al. |
| 6,844,922 B2 | 1/2005 | Bisschops et al. |
| 6,864,495 B2 | 3/2005 | Gierak et al. |
| 6,897,443 B2 | 5/2005 | Gross |
| 6,936,817 B2 | 8/2005 | Feuerbaum |
| 7,043,848 B2 | 5/2006 | Hollman et al. |
| 7,060,990 B2 | 6/2006 | Tanaka et al. |
| 7,142,300 B2 | 11/2006 | Rosengaus |
| 7,161,159 B2 | 1/2007 | Hill et al. |
| 7,211,797 B2 | 5/2007 | Nishiyama et al. |
| 7,220,963 B2 | 5/2007 | Gross |
| 7,220,973 B2 | 5/2007 | Yu et al. |
| 7,230,253 B2 | 6/2007 | Ham |
| 7,294,833 B2 | 11/2007 | Konno et al. |
| 7,301,157 B2 | 11/2007 | Buijsse et al. |
| 7,339,167 B2 | 3/2008 | Ohshima et al. |
| 7,375,351 B2 | 5/2008 | Choi et al. |
| 7,456,413 B2 | 11/2008 | Buijsse et al. |
| 7,767,979 B2 | 8/2010 | Dona |
| 8,309,921 B2 | 11/2012 | Bierhoff et al. |
| 9,025,018 B2 | 5/2015 | Bierhoff et al. |
| 2002/0024012 A1 | 2/2002 | Abe et al. |
| 2009/0200489 A1 | 8/2009 | Tappel et al. |
| 2009/0242763 A1 | 10/2009 | Buijsse |
| 2010/0276592 A1 | 11/2010 | Persoon et al. |
| 2010/0294049 A1 | 11/2010 | Kelley et al. |

FOREIGN PATENT DOCUMENTS

| | | |
|---|---|---|
| JP | 5933744 A | 2/1984 |
| JP | 0197359 A | 4/1989 |
| JP | 01296549 A | 11/1989 |
| JP | 03138841 | 6/1991 |
| JP | 03194838 | 8/1991 |
| JP | 04363849 | 12/1992 |
| JP | 0613011 A | 1/1994 |
| JP | 06275226 A | 9/1994 |
| JP | 08210987 A | 8/1996 |
| JP | 10003875 | 1/1998 |
| JP | 2005123018 | 5/2005 |
| JP | 2006073345 | 3/2006 |
| WO | 2004100206 A1 | 11/2004 |
| WO | 2007008602 A2 | 1/2007 |
| WO | 2007143734 A2 | 12/2007 |
| WO | 2007143736 A2 | 12/2007 |
| WO | 2007143737 A2 | 12/2007 |
| WO | 2007145712 A2 | 12/2007 |

OTHER PUBLICATIONS

Reimer, L., et al., 'Scanning Electron Microscope,' 1985, pp. 185-190.
Jackson, R.L. et al., "A Statistical Model of Elasto-Plastic Asperity Contact Between Rough Surfaces," Science Direct, Tribology International, 2006, vol. 39, pp. 906-914.
Khursheed, A. et al., 'Miniature Scanning Electron Microscope Design based upon the use of Permanent Magnets,' SPIE, Jan. 1, 1997, vol. 3155, pp. 175-184.
Kim, N.H. et al., "Finite Element Analysis and Experiments of Metal/Metal Wear in Oscillatory Contacts," Science Direct, WEAR, 2005, vol. 258, pp. 1787-1793.
Mathieu, C., "The Beam-Gas and Signal-Gas Interactions in the Variable Pressure Scanning Electron Microscope," Scanning Microscopy, 1999, , vol. 13, No. 1, pp. 23-41.
Norden, B.N., "On the Compression of a Cylinder in Contact with a Plane Surface," NBSIR 73-243, Final Report, Institute for Basic Standards, National Bureau of Standards, Jul. 19, 1973, 67 Pages, Washington (D.C.).
Toth, M., et al., "On the Role of Electron-Ion Recombination in Low Vacuum Scanning Electron Microscopy," Journal of Microscopy, Jan. 2002, vol. 205, No. 1, pp. 86-95.
Wanstrand, O.,"Wear Resistant Low Friction Coatings for Machine Elements," Dissertation, Acta Universitatis Upsaliensis, Uppsala 2000, 38 Pages.

* cited by examiner

USER INTERFACE FOR AN ELECTRON MICROSCOPE

The present application is a continuation of U.S. application Ser. No. 12/303,717, filed Jan. 11, 2009 which is a 371 of international Application PCT/US2007/070650, filed Jun. 7, 2007, which claims priority from U.S. Provisional Application No. 60/811,621, filed Jun. 7, 2006, all of which are hereby incorporated by reference.

TECHNICAL FIELD OF THE INVENTION

The present invention relates to a user interface for a high magnification imaging instrument, such as a scanning electron microscope.

BACKGROUND OF THE INVENTION

Electron microscopy provides significant advantages over optical microscopy, such as higher resolution and greater depth of focus. In a scanning electron microscope (SEM) a primary electron beam is focused to a fine spot that scans the surface to be observed. Secondary electrons are emitted from the surface as it is impacted by the primary beam and some electrons from the primary beam are backscattered. The secondary or backscattered electrons are detected and an image is formed, with the brightness at each point of the image being determined by the number of electrons detected when the beam impacts a corresponding spot on the surface.

Electron microscopes are typically large, complex, and expensive instruments that require skilled technicians to operate them. SEM devices typically cost well over $100,000 and require special facilities, including dedicated electrical wiring for power and venting of the vacuum pump outside of the operator area. Further, it can be difficult in a high magnification image such as that of an SEM for a user to determine where on the sample an image is being obtained and to understand the relationship between that image and the rest of the sample.

Because of the SEM's inherent complexity of operation, SEM operators are typically specially trained technicians with technical degrees. The cost of electron microscopes and the sophistication required to operate them have limited their use to research and industry with the resources to obtain this technology and to provide trained operators. With regard to the necessity of trained operators in particular, a more user-friendly interface would allow users with little or no expertise in the operation of SEM devices to take more advantage of such technology.

SUMMARY OF THE INVENTION

It is an object of the present invention is to provide an easy-to-use user interface for operation of a scanning electron microscope device.

The user interface preferably comprises a display monitor and at least one other input device, for example, a touch screen and a rotary input device.

The user interface also preferably provides a user who is not familiar with the high magnification images of electron microscopes at least one image reference so that the user readily determine where on the sample an image is being obtained and to understand the relationship between that image and the rest of the sample.

Many features, objects and advantages of the present invention will be apparent to those of ordinary skill in the relevant arts, especially in light of the foregoing discussions and the following drawings, exemplary detailed description and appended claims.

DETAILED DESCRIPTION OF THE PREFERRED EMBODIMENT

Preferred embodiments of the present invention provide an easy-to-use user interface for operation of a scanning electron microscope device. An advantage of the present invention is to provide an opportunity for unskilled users to take advantage of electron microscopy technology without the necessity of obtaining specialized, costly, and highly technical training. This can serve to make electron microscope systems much more useful and accessible in areas such as academia, including college and even high school science classes. By "user interface," applicants mean not only the graphical display by which users interact with the electron microscope, but the entire system by which the user interacts with the microscope to operate it.

Preferred embodiments of the present invention make use of a novel combination of lower magnification reference images and higher magnification images on the same screen to make it easier for a user who is not used to the high magnification of electron microscopes to readily determine where on the sample the present image is taken. Additionally, other screens, such as, for example, an archive screen and a settings screen allow the user to compare saved images and adjust the settings of the system, respectively.

The SEM assembly described for use with the present invention preferably comprises a SEM device of sufficiently small dimension that allows it to be placed atop a classroom table. Such a system is described in the commonly-owned, U.S. Provisional Patent Application 60/811,621 entitled "Compact Scanning Electron Microscope," filed on Jun. 7, 2005, by Biefhoff et al. (hereinafter "Compact SEM Application") and two corresponding PCT applications filed Jun. 7, 2007, both of which are hereby incorporated by reference. The inventive user interface, however, could be implemented on any system that forms a high magnification image, including charged particle beam systems such as a transmission electron microscope, a scanning transmission electron microscope, or a focused ion beam system, and stylus-type systems, such as a scanning tunneling microscope or an atomic force microscope.

Figure 1:
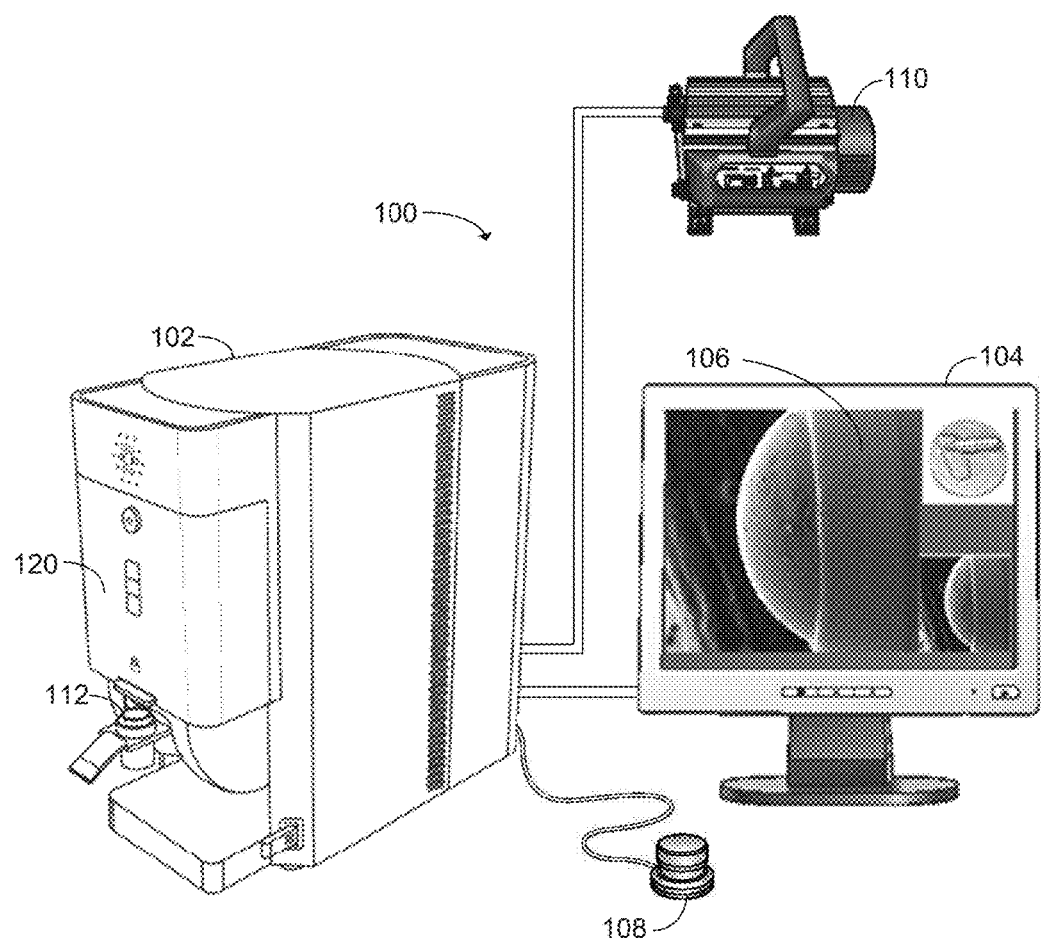
FIG. 1 shows the exterior of a preferred embodiment of an electron microscope system comprising the user interface of the present invention.

As shown in FIG. 1, a preferred SEM system 100 includes an SEM assembly 102, a video display monitor 104 for conveying information to a user, a rotary input device 108 for user inputs, and a pre-vacuum pump 110. The display monitor 104 will preferably comprise a touch screen 106, so that the user can input information by merely touching the selectable icons on the particularly displayed screen. The user interface can also include additional input devices, such as a mouse or keyboard, although a simpler interface using only touch screen 106 and rotary input device 108 is preferred.

The user interface of the present invention preferably uses controls and/or icons or virtual buttons on the displayed screen that are familiar to large numbers of users from other contexts so that use of the system is more generally understandable. For instance, a sample holder 112 can be input into SEM assembly 102 and ejected by pressing an icon on the touch screen 106 with an appearance similar to buttons typically used to eject CD and DVDs from CD and DVD players.

Figure 4:
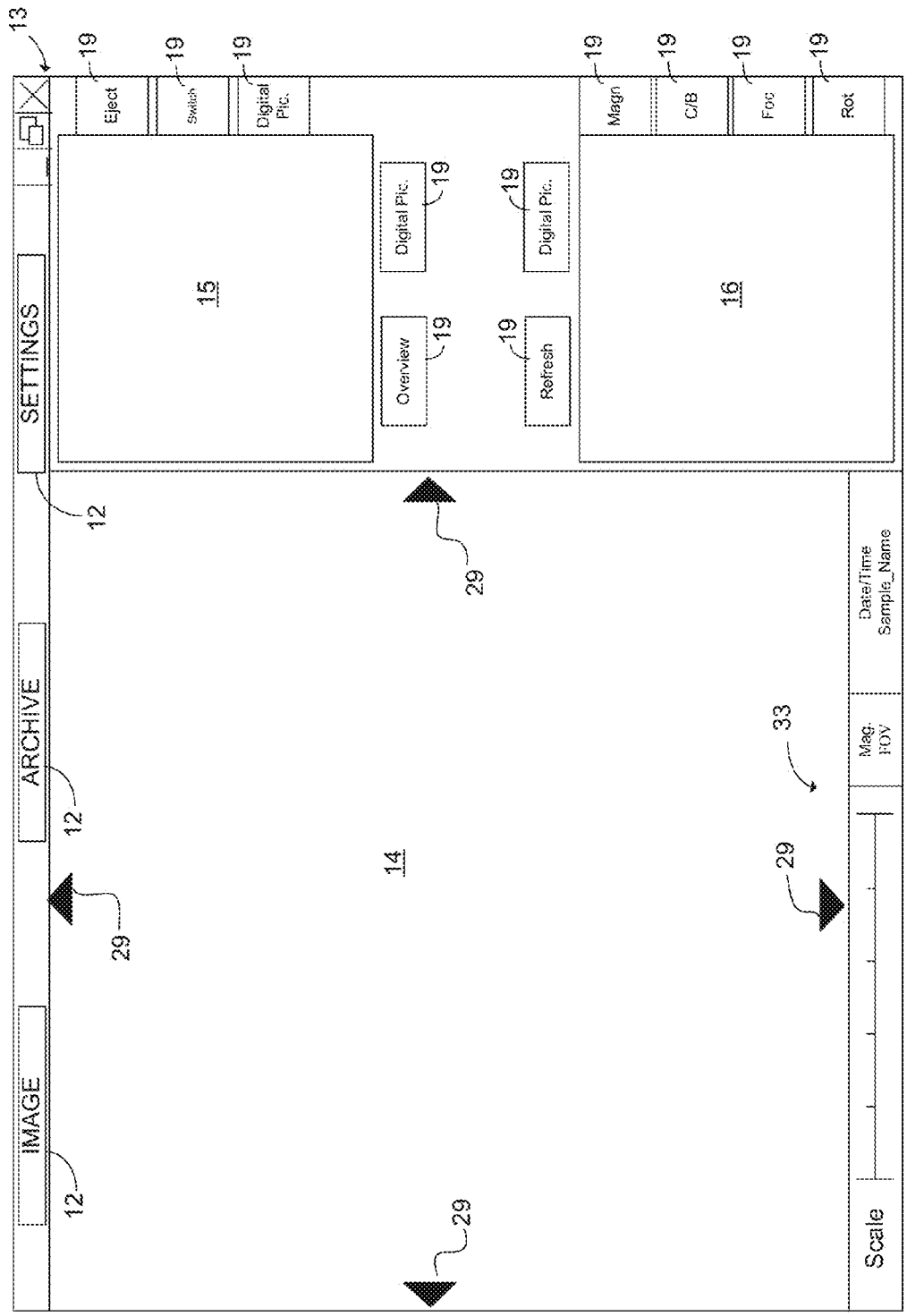
FIG. 4 shows a screenshot of the graphical portion of the user interface according to a preferred embodiment of the present invention, depicting three image windows and various selectable buttons of the main screen.

A preferred embodiment also includes an externally connected electromechanical device such as a rotary input device 108. This type of input device, also referred to as an "i-drive," is commercially available, for instance, under the trademark name POWERMATE™. The rotary input device 108 may be connected to the SEM assembly 102 or the display monitor 104, for example, through a USB port and used to choose features from the image on a display screen. The rotary input device 108 has two input functions: rotate and enter (operated by depressing the control). The rotary input device 108 can be used together with the touch screen 106 to control most operations of the system 100. Functions available on a display screen can also be selected by manually touching an icon associated with a function on the touch screen. Once activated, the particular function can be adjusted by using the rotary input device to rotate through the selections available, usually in the form of selectable icons 19 (as shown in FIG. 4) on a display screen, and then choosing the desired selection through the "enter" function of rotary input device 108 or through the touch screen 106.

Figure 2A:
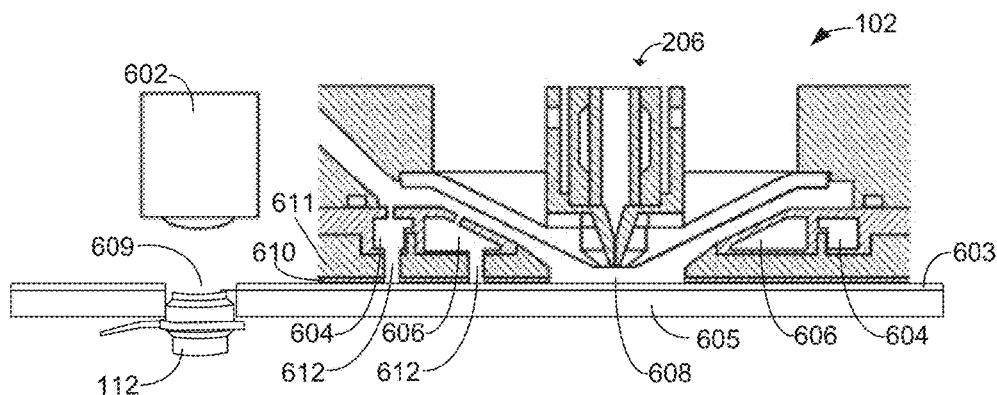
FIG. 2A shows, in a cutaway view, various details of the SEM assembly of FIG. 1 with the sample holder positioned under an optical navigation camera.
Figure 2B:
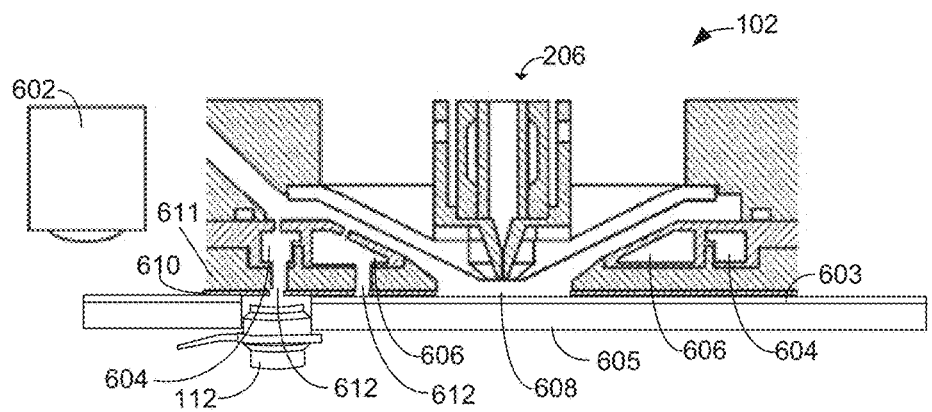
FIG. 2B shows, in cutaway view, the SEM assembly of FIG. 2A with the sample holder positioned under a pre-evacuated vacuum chamber.
Figure 2C:
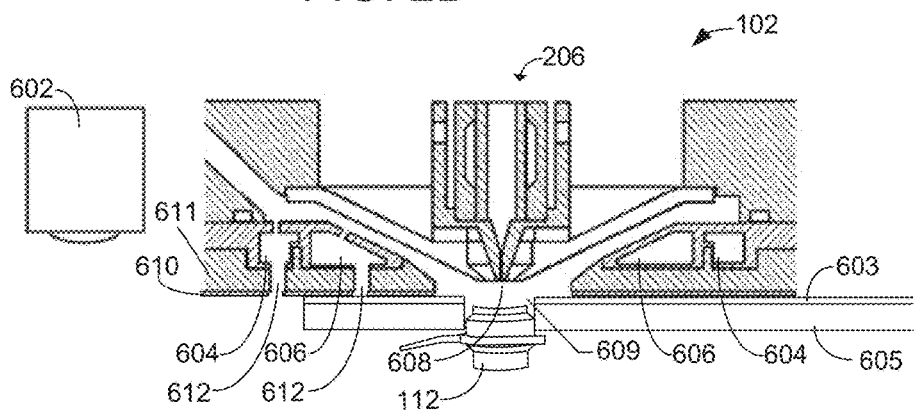
FIG. 2C shows, in cutaway view, the SEM assembly of FIG. 2A with the sample holder positioned under a scanning electron microscope.

Referring also to FIGS. 2A-2C, electron microscope assembly 102 includes a hingedly attached front cover 120, internally located optical imaging camera 602, such as CCD navigational camera, and a scanning electron microscope. Samples to be examined using system 100 are loaded into a sample holder 112, which is then inserted into electron microscope assembly 102. Preferably sample holder 112 has a sample height adjustment capability so that the sample can be properly positioned with respect to the working distance to the sample and so that the sample will not extend past the top of the sample holder (to avoid damage to the sample and to the SEM assembly).

FIGS. 2A to 2C show a sequence of steps after a sample holder is loaded into a SEM assembly suitable for use with the present invention (such as the SEM device described in the co-pending "Compact SEM Application" referenced above). An operator places a sample to be examined into a sample holder 112 outside of the electron microscope assembly 102, and the sample holder is then loaded into the front of electron microscope assembly 102. In one embodiment, a user slides up a cover 120 (FIG. 1) to expose a receptacle for receiving the sample holder, and then closes the cover 120 once the sample holder has been loaded. Closing the cover automatically causes the sample holder to move under optical camera 602 as shown in FIG. 2A.

The optical camera 602, also referred to as the navigation camera, is preferably positioned outside of any vacuum chamber. The magnification is typically from 10× up to 100×. The optical camera 602 can move up and down to focus on the sample. Movement is preferably by an electric motor, or could be manually. The camera has a field of view of about 8 mm by 8 mm. Multiple images from the camera can be tiled or stitched together to create an image of a larger portion of the sample. The tiling or stitching process can be performed automatically, with the sample being automatically moved under the camera by way of an electric motor into different positions in a serpentine pattern with each position covering a portion of the sample. In each position the image is captured, and all of the images are combined to produce an optical overview of the entire sample.

Alternatively, a user can control the movement of the camera, to produce only useful images. In manual mode, the user can move the sample under the camera by touching navigation arrows 29 (FIG. 4) on the touch screen or by pressing a point on the image can re-center the image so that the point touched is in the center of the field of view. Adjacent images displayed on the monitor 104 can optionally be adjusted to provide continuity from image to image caused by distortion or positioning inaccuracies.

As shown in FIG. 2A, sample holder 112 is held in position against a rigid sliding plate 605. A preferred embodiment uses a sliding vacuum seal between a base plate 611 on the bottom of the electron beam column and a flexible plate 603 mounted on the top surface of and attached to sliding plate 605. The sliding vacuum seal is described in more detail below with respect to FIG. 3. When the sample holder 112 is loaded into electron microscope assembly 102, the sample holder is raised up into through-hole 609 in the sliding plate 605. A radial flexible seal 702 around the side of sample holder (shown in FIG. 3) forms an airtight seal between sample holder 112 and sliding plate 605. Sliding plate 605, along with flexible sheet 603, can then maintain an airtight seal with sample holder 112 while sliding relative to the base plate 611, for example to move the sample under an opening 608 through the base plate and under the electron column 103 of the SEM (only the lower objective lens portion of the column is shown in FIGS. 2A-2C) or to adjust the sample position during viewing.

Base plate 611 also contains pre-evacuation holes 612 continuous with preferably at least two vacuum buffers 604 and 606 that comprise a volume of approximately one liter connected to a vacuum pump. Vacuum buffers 604 and 606 are typically evacuated before the sample is inserted. In FIG. 2B, as sample holder 112 is moved toward the electron column 103 for electron imaging, the sample holder is partly evacuated by passing the pre-evacuated vacuum buffers 604 and 606 that remove much of the air in the sample holder. The pressure is reduced in the sample holder roughly in proportion to the ratios of the volume in the sample holder and the volume in the vacuum buffer. Because the volumes of the pre-evacuation chambers are significantly greater than the volume of the sample holder, the pressure is greatly reduced in the sample holder, thereby greatly reducing the time required to pump the sample holder down to its final pressure for forming an electron beam image.

In FIG. 2C, when the sample holder is positioned below the electron column 103 of the SEM for imaging, the walls of the removable sample holder form part of the vacuum chamber walls; that is, the walls of the removable sample holder 112 define part of the vacuum volume below the SEM. There is no volume of a sample vacuum chamber in which a stage sits and onto which a sample is loaded as in a typical SEM. This reduces the volume that requires evacuation, thereby greatly reducing the time required before imaging can begin. In a preferred embodiment, the sample holder is sufficiently evacuated by the vacuum buffers to begin imaging immediately after the sample holder is positioned under the electron column.

Figure 3:
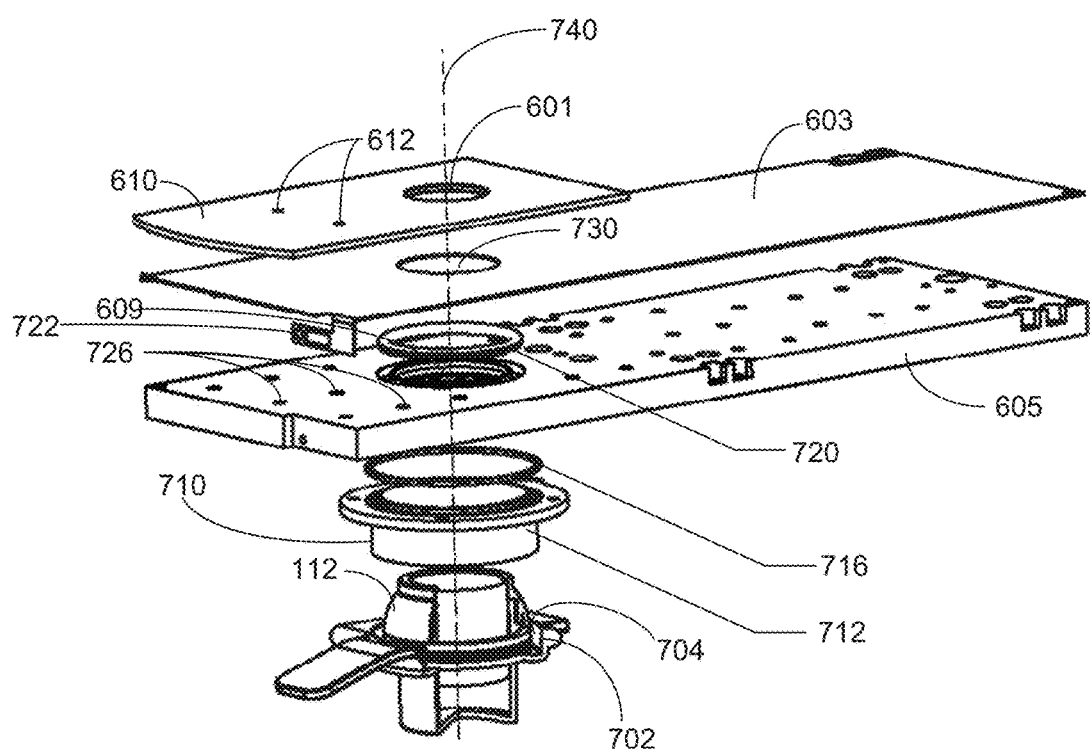
FIG. 3 shows an embodiment of a sliding vacuum seal used in the SEM assembly of FIGS. 2A to 2C.

FIG. 3 shows the positional relationship among the components in a preferred embodiment of the sliding vacuum seal. A flexible seal 702 within a groove 704 around sample container 112 seals with the interior of cylindrical portion 710 of a flanged cylinder 712 which is attached to rigid sliding plate 605 and sealed by an o-ring 716 against rigid sliding plate 605. Flexible stainless steel plate 603 is clipped (using clip 722) to sliding plate 605 and moves with sliding plate 605. Referring also to FIGS. 2A to 2C, to move sample container 112 into position under the axis 740 of the electron column 103 of the SEM, the sliding plate 605 slides along glacier layer 610 attached to the base plate 611 of the electron beam column 102. Springs (not shown) can be inserted into blind holes 726 in the rigid sliding plate 605 to press the flexible sheet 603 against the glacier layer 610 to ensure a better vacuum seal around holes in the glacier layer, such as the holes 612 that connect the sample container 112 with vacuum buffers 604 and 606 and the holes through which the electron beam passes (glacier plate through-hole 601, sliding plate through-hole 609, and flexible plate through-hole 730). A flexible seal 720 seals flexible plate 603 relative to rigid sliding plate 605. Using a flexible plate between the rigid plate and the microscope base reduces the sliding frictional force needed to slide the rigid plate and makes the sliding force more consistent. Using glacier layer 610 on the bottom of plate 611 reduces friction and reduces the generation of particles.

The edges of the holes in rigid sliding plate 605 are contoured to reduce frictions, as described in PCT Application No. PCT/US2007/010006 to Persoon et al., filed Apr. 27, 2007, for "Slider Bearing for use with an Apparatus Comprising a Vacuum Chamber," which is hereby incorporated by reference. The curvature is preferably such that the Herztian contact pressure between the moving parts will also minimize particle generation.

In some embodiments, the system can automatically determine the height of the sample within the sample holder 112 based upon the focus of the optical camera and then adjust the focus of the electron beam accordingly. The optical camera 602 has a known focal length, so when the sample is in focus, the distance between the sample and the camera can be determined. This distance is used to determine the sample height for adjusting the SEM focus. The height setting of the sample holder 112 may be automatically communicated to a system controller, which can automatically adjust the SEM. The SEM is then automatically adjusted over a continuous range for any working distance or magnification. Settings for the actual sample position are determined by interpolating between setting for a high sample position and a low sample position. The focus can be "fine tuned," either automatically or manually, after being roughly set based on the sample mount height within the sample holder. Another embodiment uses two preset height adjustments in the sample holder; one for a wide field of view and one a narrow field of view. Adjustment for the working distance of the objective lens is made depending on which of the two pre-set working distances are chosen.

Main Image Screen

When the sample is imaged at the high magnification of the SEM, it can be difficult for an untrained operator to determine the location on the sample from which the image is being obtained and to understand the relationship between the image and the rest of the sample. As shown in FIGS. 4-8, the preferred main image screen 13 of the graphical portion of the user interface includes three "image windows" that remain on the display to help the user put a magnified image in context. One window, referred to as the active image window 14, shows the current image. Depending upon the current operation being performed, the current image may be an image taken when the sample is under the optical navigation camera 602, an image formed by the SEM when the sample is under the electron column 103 of the SEM, or an image recalled from a storage medium, as discussed below.

Another image window, referred to as the optical overview window 15, shows an image from the optical navigational camera 602. The image is typically obtained and stored before the sample holder is evacuated and before the sample is moved under the SEM, although the sample could also be moved back from the electron beam to the navigation camera if desired. As described above, the image in the optical overview window 15 may be formed from multiple fields of view of the optical navigational camera juxtaposed to form a single image, or the image can be from a single field of view of the optical navigational camera.

The remaining image window, referred to as the electron beam overview window 16, shows a relatively low magnification electron beam image. The image in the electron beam overview window 16 is preferably obtained at the lowest available magnification for the particular working distance. When the sample is first imaged with the electron beam, the image in the live window and the electron beam overview window will be the same. When the magnification of the active image is increased, the original relatively low magnification image will remain in the electron beam overview window to provide an additional reference for the operator. If the electron beam overview window is then refreshed, the SEM system will drop down to the lowest available magnification, re-image the sample, and then return to the original increased magnification for the active image.

The main viewing screen 13 may include a data bar 33 at the lower portion of the main viewing window 13 that shows, for instance, the date, time, magnification and scale of the current image. A data bar 33 may also be included on the electron beam overview window 16. Navigation arrows 29 on the four sides of the active viewing window 14 allow the user to move the image to show different parts of the sample. A user can also touch any portion of the current image to re-center the image on the touched position, or by "clicking and dragging" the image, should a mouse or similar input device be employed, as will be understood by those of ordinary skill in the art. As described above, the touch screen 106 enables a user to merely touch the display monitor 104 to activate a desired function. In this case, a user may depress the image being displayed in the optical overview window 15 and drag it to a desired position and, finally, release to set the image in a desired location within the window 14. A stylus may be used to this extent, or a user may simply use a finger.

Various selectable icons 19 (FIG. 4) positioned along the edges of the windows, such as an switch icon 23 (FIG. 5) for acquiring an image either from the optical navigational camera 602 or the scanning electron microscope, an eject icon 26 for loading and unloading the sample holder into the loading bay of the SEM assembly 102, an overview icon 22 for obtaining an optical overview of the entire sample, and various digital picture icons 34 for saving an image to removable media. Many of the icons shown in FIG. 4 include text that portrays the command or feature which the icon selectively represents. However, as shown in FIGS. 5-9, such icons may alternatively make use of an image or graphical representation to indicate their respective functions, such as, for example, a camera icon representing a "save to digital file" function. A selectable icon to load/unload the sample, for example, may be provided by an icon similar to that used on CD players to load/unload the sample holder into the area of the navigational camera or into the area of the SEM. Pressing the eject icon 26 unloads the sample holder from the system, and the other selectable icons operate in similar fashion.

Figure 10:
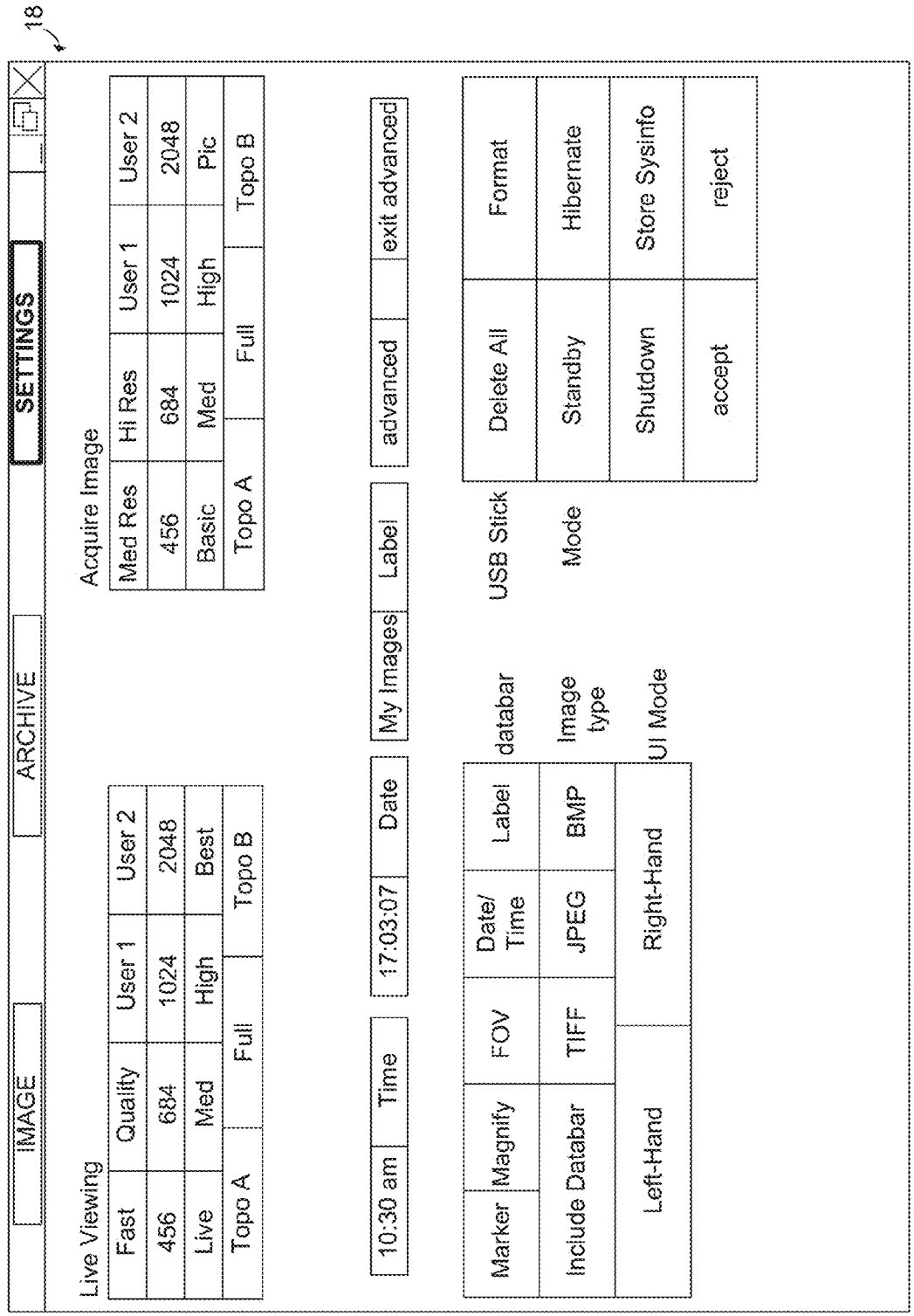
FIG. 10 shows a screenshot of the settings screen of the user interface according to a preferred embodiment of the present invention.

Selectable icons 19 can be used together with a rotary input device 108 or other mechanical input device. For instance, when the user presses the magnification icon 27, for example, rotating the control on the rotary input device 108 will increase or decrease the magnification. Depressing the rotary input device 108 will change the control from coarse magnification to fine magnification control. When the control is "fine," an "F" (not shown) appears on the magnification icon 27 to indicate that the fine control is operating. Toggling from coarse to fine and back can be done by depressing the rotary input device control 108 or by touching the magnification icon 27 on the screen 13. The controls are similar for the contrast/brightness 31, focus 28, and rotation 25 buttons. Regarding the contrast/brightness icon 31, pressing the rotary input device 108 once associates the rotation control on the rotary input device 108 with brightness control, and pressing the rotary input device 108 a second time associates the rotation control with contrast control. Contrast and brightness can also be controlled automatically, if the user has set those functions for automatic control under the settings screen (as shown in FIG. 10) discussed in greater detail below.

The digital picture icons 34 function to store the image displayed in the corresponding window. The image is typically saved to a USB memory stick that plugs into the system. In one preferred embodiment, the system has no user accessible memory, and all images are saved to a removable medium. In another embodiment, the system is connected to the internet, and images can be saved to a web address or sent via e-mail. The use of removable memory makes the system particularly useful in academic environments, in which students can use the system, save their images, and take their images with them or send them over the internet.

Figure 5:
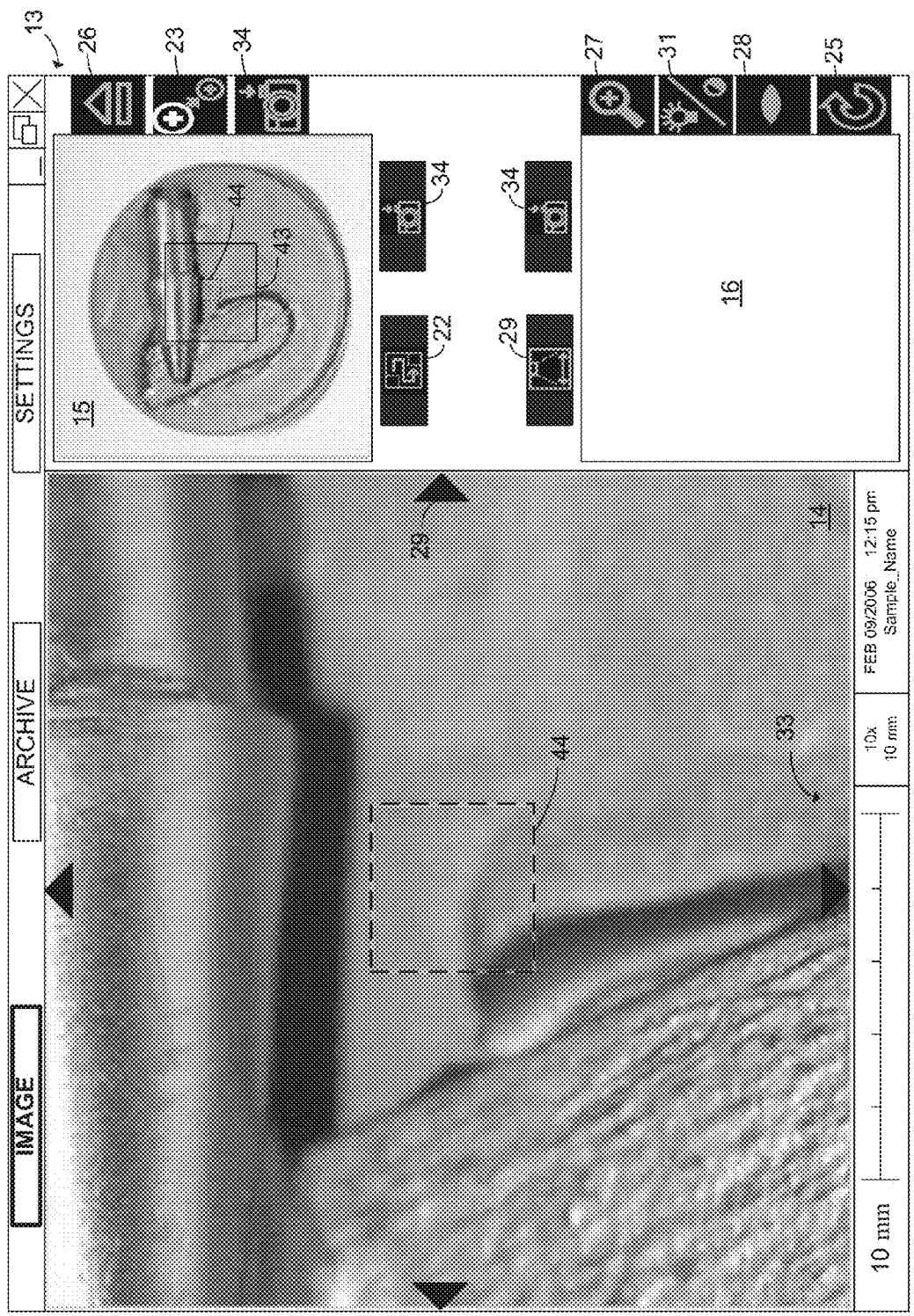
FIG. 5 shows the screenshot of FIG. 4 with an image taken by the optical navigational camera shown in the smaller optical overview window and a magnification of the image shown in the larger main viewing window with a perimeter indicator imposed on the images.

The uses of these different image windows to allow an inexperienced user to easily operate the SEM will now be discussed with reference to FIGS. 5 to 9. In a preferred embodiment, once a sample has been loaded into the SEM, the sample is transferred automatically to the optical imaging position (as shown in FIG. 2A). The optical navigational camera is then activated and, as shown in FIG. 5, an optical image of the sample (a ball point pen tip in this example) is displayed in the optical overview window 15. A more magnified optical image is displayed in the main viewing window 14.

FIG. 5 shows the use of two rectangular perimeter indicators; a large perimeter indicator 43 and a smaller perimeter indicator 44 inside the larger indicator. Perimeter indicator 43 is shown as a solid line, while smaller indicator 44 is shown by a dashed line. Both indicators are superimposed over the optical image to indicate the area of the sample to be imaged. The larger indicator 43 serves to indicate the approximate perimeter of the entire magnified image as seen in the main viewing window 14. The smaller indicator 44 indicates the area of the sample that will be imaged by the electron beam. When using a color display monitor, any perimeter indicators will preferably be of a color that easily stands out as imposed against the image. One of ordinary skill in the art will readily recognize that the perimeter indicators also serves as a reference indicator so that a user may more easily locate which area of the image is in fact in the magnified main viewing window 14 by referencing the perimeter indicator imposed over the image from the optical overview window 15. The perimeter indicators may be take other shapes such as, for example, a cross or circle.

Figure 6:
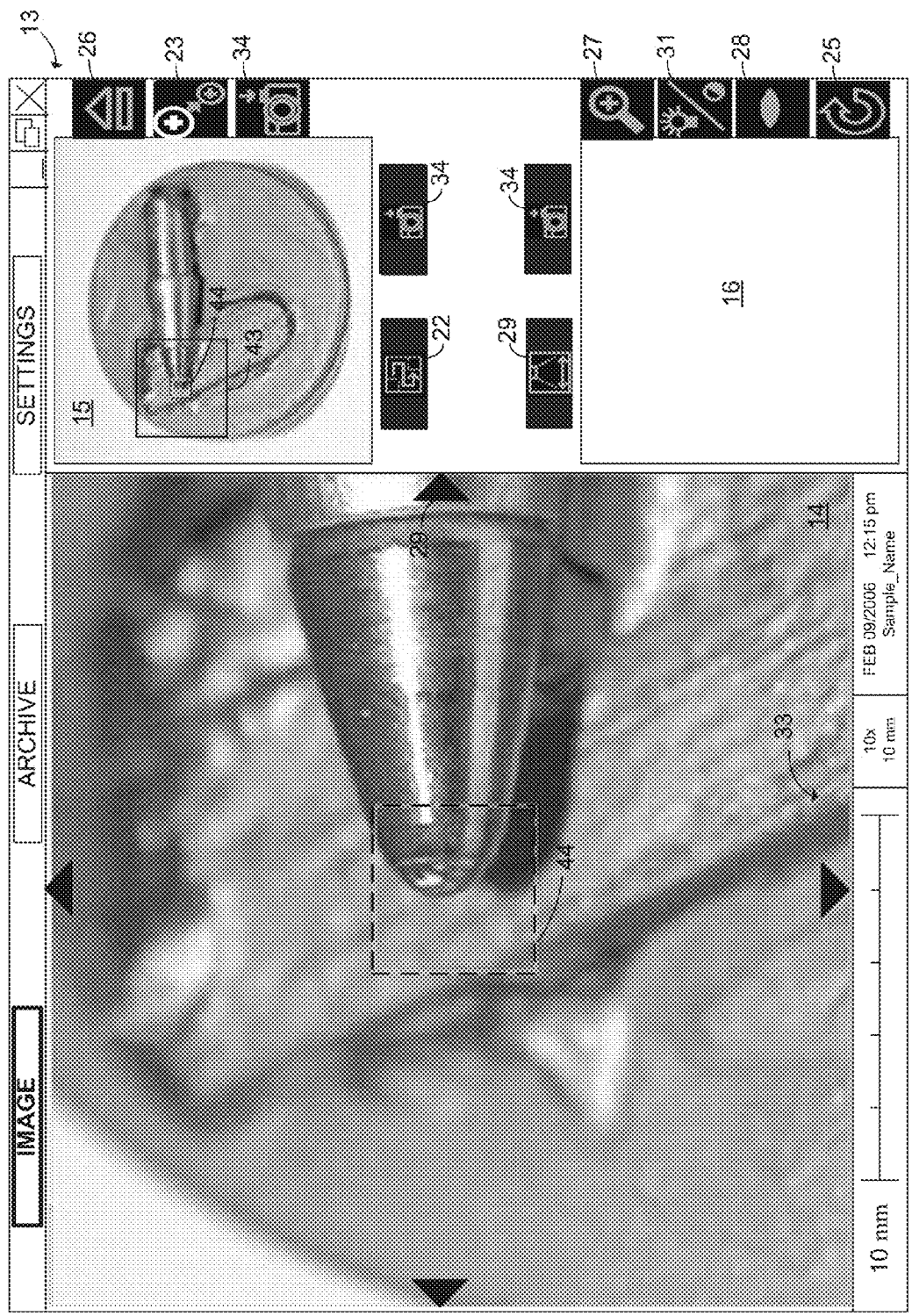
FIG. 6 shows the screenshot of FIG. 5 with the perimeter indicator moved to a different area of the image.

Once the two images have been displayed, the portion of the sample to be examined under the SEM can be moved to the center of the optical field of view. This can be accomplished, for example, by touching a particular point in either image on the touch screen display and allowing the point to be automatically centered or by inputting instructions to move the sample, for example by using directional arrows 29 located either on the screen or by using a keyboard (not shown). FIG. 6 shows the user interface screen after centering the tip of the ball point pen.

After the part of the sample to be viewed has been centered, the sample can be imaged using the SEM. Electron imaging can be selected, for example, by using the "switch" icon 23 as shown in FIG. 6 to switch from optical imaging to electron imaging. Switch button 23 can be indicated, for example, either by text or by an icon showing a large and a smaller shape, each having a cross therein may also be available. In this example, the smaller shape represents the optical camera 602 and the larger shape represents the electron microscope. When the button is pressed, the sample moves between the optical camera position (as shown in FIG. 2A) and the electron microscope position (as shown in FIG. 2B). An arrow on the button can be used to indicate where the sample will go when the button is pressed.

Figure 7:
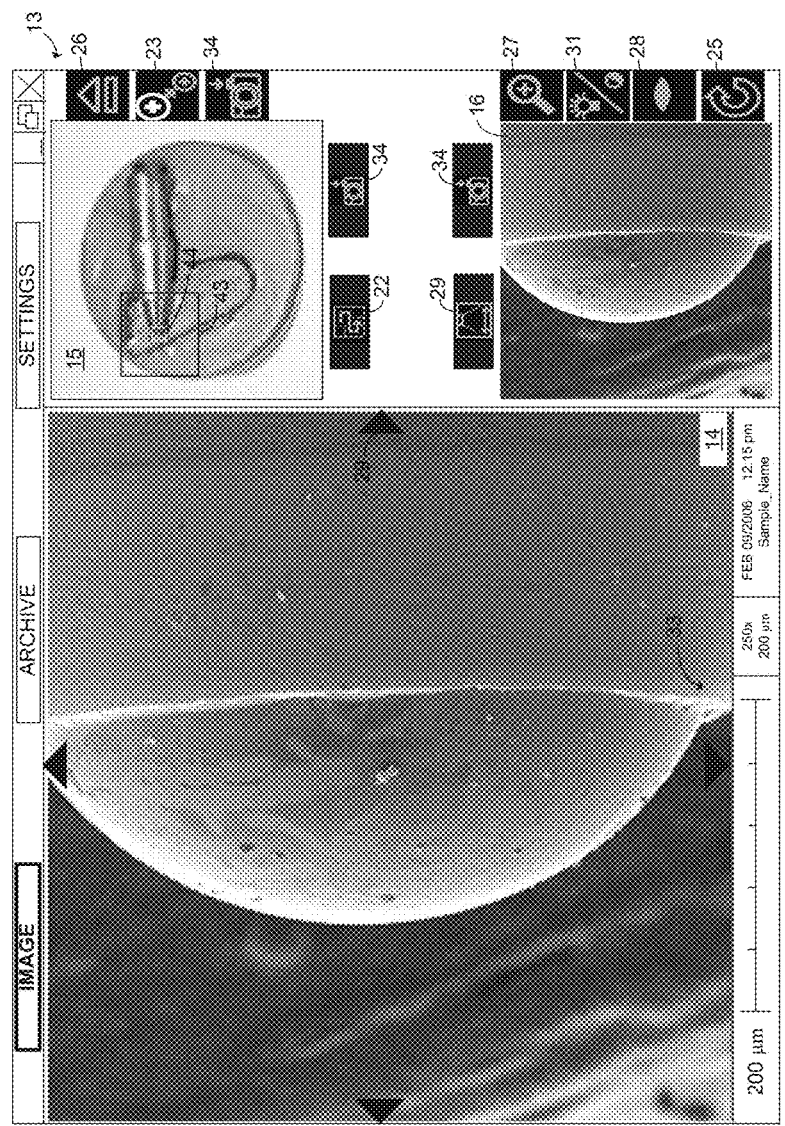
FIG. 7 shows a screenshot with a the same low magnification electron microscope image of the area selected on the optical window of FIG. 6 shown in the large main image window and in the smaller electron beam overview window.

In FIG. 7, the image produced by SEM 93 is shown in both the main viewing window 14 and the electron beam overview window 16. In the example of FIG. 7, the image is initially displayed in the lowest possible magnification. The image shown in the main viewing window 14 can then be magnified as desired, for example by selecting magnification button 27 and then operating a magnification slider on the screen (not shown), turning the rotary input device 108, or directly inputting a desired magnification.

Figure 8:
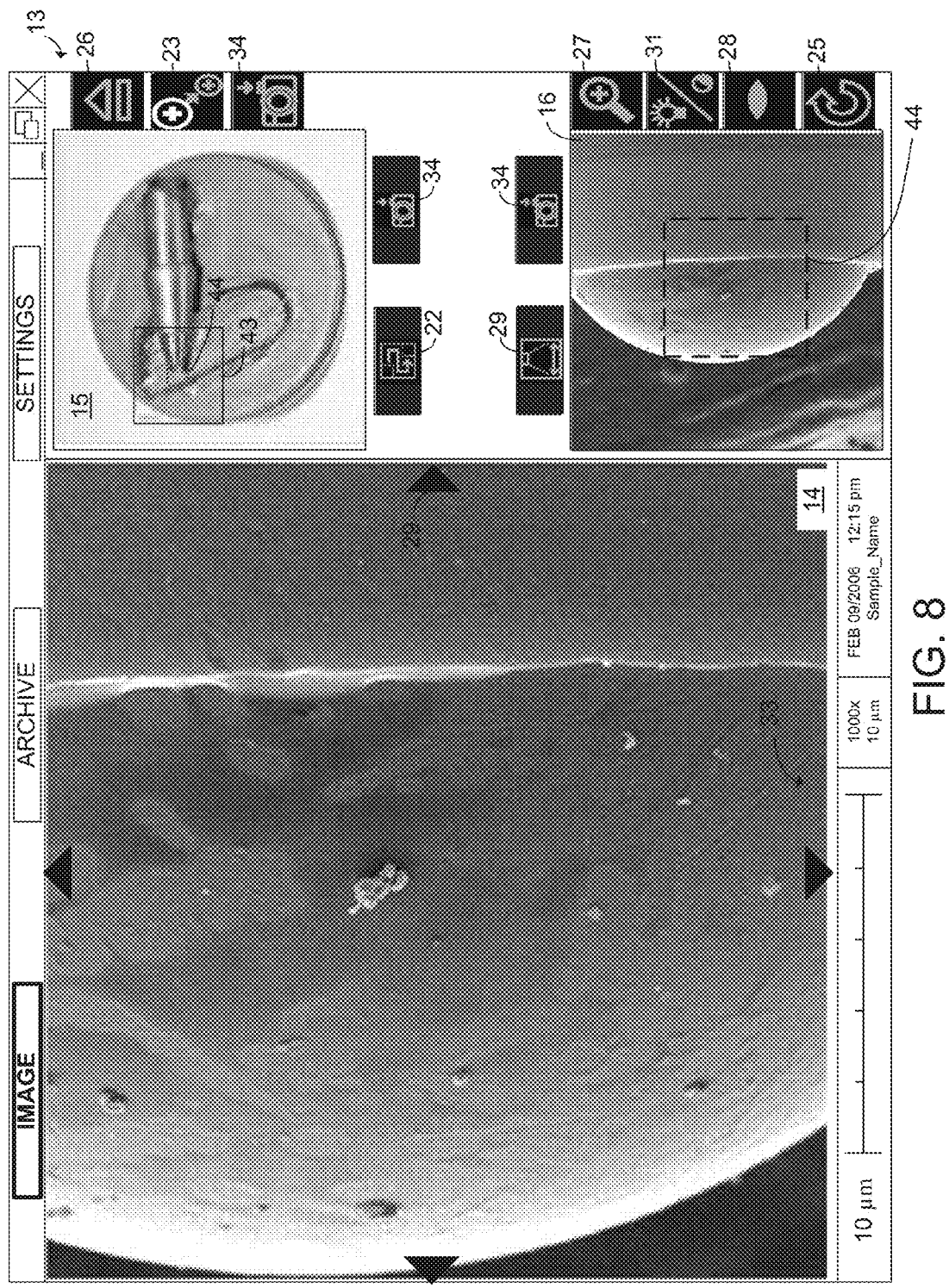
FIG. 8 shows the screen shot of FIG. 7 with the main image screen showing a higher magnification electron microscope image area of the area indicated by the perimeter indicator in the electron beam overview window.

The magnified image will then be shown in main viewing window 14 as shown in FIG. 8. The image in the optical overview window 15 typically remains unchanged after the sample leaves the optical camera and moves under the SEM. The image in the electron beam overview window 16 is typically at a magnification that is too large to show the entire sample. When the sample is moved under the SEM, the main viewing window 14 may show a portion of the sample that is outside the image in the electron beam overview window 16. In that case, the image in the electron beam overview window 16 can be automatically or manually changed to show an overview of a portion of the sample that is a superset of the portion shown in the main viewing window 14. For example, if the user presses a refresh icon 29 on the main screen 14 near the electron beam overview window 16, a new low magnification electron beam image will be obtained that is centered on the same spot as the main viewing window 14. A new image may be acquired, for example, if the image in the main viewing window 14 has been moved so that the image in the main viewing window 14 corresponds to a point on the sample outside the image in the electron beam overview window 16. The low magnification image may be obtained by increasing the beam deflection. The low magnification image may have, for example, a 400 µm field of view, and if the sample is moved one millimeter, it would be necessary to obtain another low magnification image.

As described above, a perimeter indicator, such as a colored rectangle or cross, on the optical overview window 15 shows the location of the image in the electron beam overview window 16. Similarly, a perimeter indicator 45 on the electron beam overview window image indicates the position and preferably the relative size of the image in the main viewing window 14 on the electron beam overview window image. For example, as the magnification of the main viewing window 14 is increased, the perimeter indicator on the electron beam overview window 16 will get smaller to correspond to the smaller area that is shown in the higher magnification image in the main viewing window 14.

With the perimeter indicators as described above, a user can readily determine at high magnification where on the sample he or she is viewing in the main viewing window 14, thereby providing a context to even a user that is not familiar with high magnification images.

In addition to the main image screen, the preferred embodiment of a user interface shown in FIGS. 4-9 also includes tabs 12 enabling a user to access the other two screens: the archive screen 17 and the settings screen 18 (or to return to the main image screen from either of the two additional screens.

Archive Screen

Figure 9:
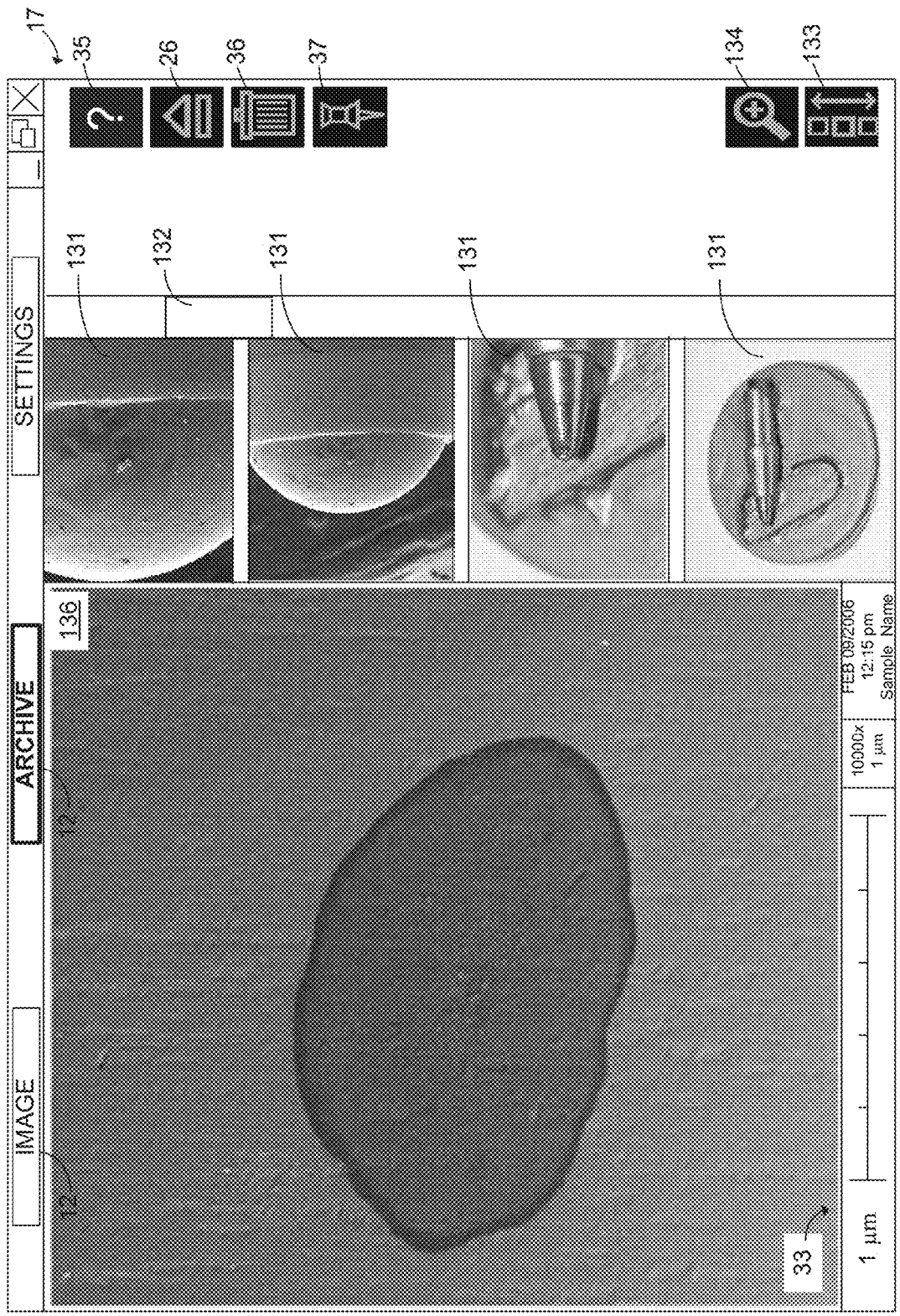
FIG. 9 shows a screenshot of the archive screen of the user interface according to a preferred embodiment of the present invention.

As shown in FIG. 9, the archive screen 17 lets the user browse and operate on images stored on the removable memory media. The archive screen 17 is similar to the main screen 13 and includes an active image window 136 and a thumbnail gallery 131 of saved images for comparing and manipulation. A data bar 33 may be included on the archive screen 17, in similar fashion as used in the main screen 13. The controls, or selectable icons 19, are similar to those of a digital camera memory and include icons for accessing a help file 35, ejecting a sample 26, deleting an image 36, holding an image to compare a selected image with other images 37, zooming 134, and browsing 133 through the image gallery. A scroll bar 132 is also included for scrolling through the thumbnail gallery 131. The user can perform other image manipulation that would be available on a digital camera or photo editing software.

Settings Screen

As shown in FIG. 10, the settings screen 18 provides certain user settable functions. For example, the user can select which detector configuration to be used to form the electron beam images. A "fast" scan setting allows fast image refresh times, but provides images of lower resolution. A "quality" scan setting allows slower image refresh times and high quality resolution. Through the settings screen, a user can select viewing a live image in "fast" mode while saving the image in "quality" mode, and delete and format the USB memory stick, or other removable storage medium. Date and time can be set and labels created for images. A user can select which format to save the image file, whether it is a TIFF, JPEG or BMP format. The user can also set whether to automatically adjust brightness and contrast, and how often to make the adjustments. For example, brightness and contrast might be adjusted whenever the image is moved, or periodically. The stigmation is adjusted once in the user settings, and then is typically stable, not requiring additional adjustment. At least one user profile selection can be selected to store the settings of particular users for faster processing and operation times.

To maintain a simple user interface, the beam energy and current is typically preset at the factory and not adjustable by the user. During assembly, standard set up functions are performed, such as mechanically aligning to center the Wehnelt cap and filament over the anode.

In a preferred embodiment, more advanced options for controlling and optimizing the SEM system are available but protected by a password to prevent access by less experienced operators. For example, source tilt can be adjusted to optimize electron beam illumination intensity; a stigmate control allows adjustment of the sharpness of the electron image contours; and stage position and rotation can be calibrated stage to insure that the part of the sample being viewed is the same in both optical and electron imaging mode.

A preferred embodiment of the present invention comprises an electron microscope system including:

a sample holder for holding a sample;

an optical camera for recording an optical image at a first magnification of a first region of the sample, the sample positioned in the sample holder outside of a vacuum region while the optical image is recorded;

an electron microscope for forming an electron image at a second magnification of a second region of the sample while the sample is positioned in the sample holder, the second magnification being greater than the first magnification and the second region being a subset of the first region; and a display displaying (preferably simultaneously) the position of the electron image and the second region being indicated on the optical image of the first region so that a user can determine the position on the sample of the electron image.

Another preferred embodiment of the present invention further displays an electron overview image of a third region, the electron overview image having a magnification less that the second magnification and greater than the first magnification, the third region being a subset of the first region, and a superset of the second region, the second region being indicated on the display of the third region.

Still another preferred embodiment of the present invention provides a method of operating an electron microscope, comprising:

moving a sample in a sample holder into the filed of view of an optical camera;

obtaining and storing an optical image of a portion of a sample outside of a vacuum;

moving the sample into an electron microscope;

obtaining an electron image of the sample, the electron image having a magnification greater than that of the optical image;
displaying the electron image of the sample and the stored optical image on a display screen, the display of the stored optical image including an indicator showing the position on the stored optical image of the position of the electron image of the sample;
changing the field of view of the electron image to obtain a different image of the sample; and
automatically adjusting the indicator on the optical image to reflect the new field of view of the electron image, thereby displaying to a user the position of the electron image on the sample.

The invention described above has broad applicability and can provide many benefits as described and shown in the examples above. The embodiments will vary greatly depending upon the specific application, and not every embodiment will provide all of the benefits and meet all of the objectives that are achievable by the invention. For example, although much of the previous description is directed at the use of a user interface with a table-top SEM, the invention could be applied to any suitable electron microscope or other high magnification imaging device.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of operating an electron microscope, comprising:
moving a sample in a sample holder into a field of view of an optical camera;
obtaining and storing an optical image of a portion of the sample outside of a vacuum;
moving the sample into an electron microscope;
obtaining an electron image of the sample, the electron image having a magnification greater than that of the stored optical image;
simultaneously displaying on a display screen:
a field of view of the electron image in a first window, the stored optical image in a second window, and
a perimeter indicator superimposed on the stored optical image in the second window, the perimeter indicator indicating on the stored optical image the position of the electron image and the area of the field of view on the sample; and
changing the field of view of the electron image to obtain a different electron image of the sample, by inputting directions from a user through a touch screen; and
automatically adjusting the perimeter indicator in the second window to indicate the position of the different electron image and the area of the new field of view on the stored optical image.

2. The method of claim 1 further comprising displaying an electron overview image of the sample, the electron overview image being formed by the electron microscope and having a magnification greater than that of the stored optical image and less than that of the electron image.

3. The method of claim 1 in which changing the field of view of the electron microscope includes changing the magnification.

4. The method of claim 1 in which obtaining and storing the optical image of the portion of the sample includes obtaining multiple images of adjacent regions of the sample and juxtaposing the multiple images to provide an image of a region of the sample larger than the field of view of the optical camera.

5. The method of claim 1 in which obtaining the electron image of the sample includes moving the sample into contact with a vacuum region to remove air from around the sample before the sample is positioned under an objective lens for imaging.

6. The method of claim 5 in which obtaining the electron image of the sample occurs within thirty seconds of moving the sample from an atmosphere environment into the electron microscope.

7. The method of claim 1 further comprising automatically focusing the electron microscope to a focal plane determined by a focal adjustment of the optical camera to focus on the sample.

8. An electron microscope system, comprising:
a sample holder for holding a sample;
an optical camera for recording an optical image at a first magnification of a first region of the sample, the sample positioned in the sample holder outside of a vacuum region while the optical image is recorded;
an electron microscope for forming an electron image at a second magnification of a second region of the sample while the sample is positioned in the sample holder, the second magnification being greater than the first magnification and the second region being a subset of the first region; and
a display comprising a touch screen, the display:
configured to simultaneously display the electron image, the optical image, and a perimeter indicator superimposed on the optical image, the perimeter indicator indicating the position of the electron image and the area of the second region on the optical image so that a user can determine the position of the second region on the sample, and
configured such that touching a position of the electron image on the display changes the field of view of the electron image shown by the display by centering the electron image on the position touched, and
wherein the perimeter indicator is automatically adjusted on the optical image to indicate the position and area of the electron image in the first region after the change in the field of view.

9. The electron microscope system of claim 8 in which the first region comprises a juxtaposition of multiple optical images.

10. The electron microscope system of claim 8 further comprising a removable memory media for storing images.

11. The electron microscope system of claim 10 in which the removable memory media for storing images comprises a USB flash drive, a CD or a DVD.

12. The electron microscope system of claim 10 in which all of the images are stored in the removable memory media.

13. The electron microscope system of claim 12 further comprising a rotary input device for user input.

14. The electron microscope system of claim 8 further comprising an objective lens and at least one vacuum buffer region to remove air from around the sample before the sample is positioned under the objective lens for imaging.

15. The electron microscope system of claim 8 in which the electron beam energy is not adjustable by the user.

16. The electron microscope system of claim 8 in which the electron microscope is automatically focused to a focal plane determined by a focal adjustment of the optical camera to focus on the sample.

* * * * *